(12) United States Patent
Palaniappa et al.

(10) Patent No.: US 6,533,589 B1
(45) Date of Patent: Mar. 18, 2003

(54) PACKAGED DEVICE ADAPTER ASSEMBLY

(75) Inventors: Ilavarasan Palaniappa, Apple Valley, MN (US); Mickiel Fedde, Eagan, MN (US)

(73) Assignee: Ironwood Electronics, Inc., Eagan, MN (US)

( * ) Notice: Subject to any disclaimer, the term of this patent is extended or adjusted under 35 U.S.C. 154(b) by 0 days.

(21) Appl. No.: 09/418,388

(22) Filed: Oct. 14, 1999

(51) Int. Cl.[7] .................................................. H01R 9/01
(52) U.S. Cl. ......................................... 439/71; 439/331
(58) Field of Search ............................. 439/71, 72, 73, 439/74, 630, 68, 331; 174/117 A

(56) References Cited

U.S. PATENT DOCUMENTS

| | | |
|---|---|---|
| 2,578,288 A | 12/1951 | Cook |
| 2,951,817 A | 9/1960 | Myers |

(List continued on next page.)

FOREIGN PATENT DOCUMENTS

| | | |
|---|---|---|
| EP | 0 905 826 A2 | 3/1999 |

OTHER PUBLICATIONS

Ironwood Electronics, Inc. VLSI Interconnection Specialists Catalog XII (pp. 84, 110) (product on p. 110 available at least as early as Oct. 4, 1998).

*Primary Examiner*—Lynn D. Feild
*Assistant Examiner*—Phuong Dinh
(74) *Attorney, Agent, or Firm*—Mueting, Raasch & Gebhardt, P.A.

(57) ABSTRACT

An adapter apparatus is provided for receiving a packaged device having a plurality of contact elements disposed on a surface thereof. The adapter apparatus includes a perimeter wall member having a length along an adapter axis between a first end of the wall member and a second end of the wall member. A conductive element layer including arranged contact elements is positioned at the first end of the perimeter wall member orthogonal to the adapter axis. The perimeter wall member and the conductive element layer define a socket cavity to receive the packaged device with the contact elements thereof adjacent the arranged conductive elements of the conductive element layer. A cover member is positioned at the second end of the perimeter wall member to close the socket cavity. The cover member is movable to allow the packaged device to be removed from the socket cavity. The adapter apparatus may include a floating member moveable in the socket cavity and an actuator element operable to provide a force on the floating member such that a corresponding force is distributed to the packaged device when received in the socket cavity to provide effective electrical coupling between the contact elements of the packaged device and the arranged conductive elements of the conductive element layer, e.g., a conductive elastomer layer. Further, the perimeter wall member may include an inner surface facing towards the adapter axis and an outer surface facing in an opposing direction. The outer surface of the perimeter wall member may include an adhesive retaining surface adjacent the first end thereof, e.g., channels adjacent the first end, for use in receiving an adhesive to mount the assembly to a target board. Yet further, the adapter apparatus may include an alignment structure positioned in the socket cavity adjacent the conductive element layer and adjacent the surface of the packaged device on which the contact elements are disposed to align the contact elements of the packaged device with contact pads on a target board when the adapter apparatus is mounted relative thereto.

31 Claims, 9 Drawing Sheets

U.S. PATENT DOCUMENTS

| | | |
|---|---|---|
| 3,229,756 A | 1/1966 | Keresztury |
| 3,728,509 A | 4/1973 | Shimojo |
| 3,760,342 A | 9/1973 | Prouty et al. |
| 3,870,385 A | 3/1975 | Avakian et al. |
| 3,971,610 A | 7/1976 | Buchoff et al. |
| 4,295,699 A | 10/1981 | DuRocher |
| 4,514,784 A | 4/1985 | Williams et al. |
| 4,550,959 A * | 11/1985 | Grabbe et al. .............. 439/630 |
| 4,655,524 A | 4/1987 | Etzel |
| 4,668,957 A | 5/1987 | Spohr |
| 4,678,250 A | 7/1987 | Romine et al. |
| 4,729,166 A | 3/1988 | Lee et al. |
| 4,754,546 A | 7/1988 | Lee et al. |
| 4,862,076 A * | 8/1989 | Renner et al. ................ 439/68 |
| 4,923,739 A | 5/1990 | Jin et al. |
| 5,074,799 A | 12/1991 | Rowlette, Sr. |
| 5,123,849 A | 6/1992 | Deak et al. |
| 5,127,837 A * | 7/1992 | Shah et al. ................... 439/71 |
| 5,129,833 A | 7/1992 | Rowlette, Sr. |
| 5,137,462 A | 8/1992 | Casey et al. |
| 5,140,405 A | 8/1992 | King et al. |
| 5,155,661 A | 10/1992 | Nagesh et al. |
| 5,163,837 A | 11/1992 | Rowlette, Sr. |
| 5,286,218 A | 2/1994 | Sakurai et al. |
| 5,313,099 A | 5/1994 | Tata et al. |
| 5,318,456 A | 6/1994 | Mori |
| 5,340,318 A | 8/1994 | Kunihiro |
| 5,377,900 A | 1/1995 | Bergmann |
| 5,387,861 A | 2/1995 | Neiderhofer |
| 5,389,819 A | 2/1995 | Matsuoka |
| 5,397,240 A | 3/1995 | Herard |
| 5,397,245 A | 3/1995 | Roebuck et al. |
| 5,397,919 A | 3/1995 | Tata et al. |
| 5,418,471 A | 5/1995 | Kardos |
| 5,432,679 A | 7/1995 | Grabbe |
| 5,445,526 A | 8/1995 | Hoshino et al. |
| 5,468,158 A | 11/1995 | Roebuck et al. |
| 5,473,510 A | 12/1995 | Dozier, II |
| 5,477,160 A | 12/1995 | Love |
| 5,528,462 A | 6/1996 | Pendse |
| 5,548,223 A | 8/1996 | Cole et al. |
| 5,566,052 A | 10/1996 | Hughes |
| 5,636,996 A | 6/1997 | Johnson et al. |
| 5,662,163 A | 9/1997 | Mira |
| 5,667,870 A | 9/1997 | McCullough |
| 5,691,041 A * | 11/1997 | Frankenny et al. ........... 439/74 |
| 5,699,227 A | 12/1997 | Kolman et al. |
| 5,710,459 A | 1/1998 | Teng et al. |
| 5,712,768 A | 1/1998 | Werther |
| 5,730,620 A | 3/1998 | Chan et al. |
| 5,735,698 A | 4/1998 | Bakker et al. |
| 5,741,141 A | 4/1998 | O'Malley |
| 5,742,481 A | 4/1998 | Murphy et al. |
| 5,745,346 A | 4/1998 | Ogawa et al. |
| 5,766,022 A | 6/1998 | Chapin et al. |
| 5,770,891 A | 6/1998 | Frankeny et al. |
| 5,783,461 A | 7/1998 | Hembree |
| 5,793,618 A | 8/1998 | Chan et al. |
| 5,805,424 A | 9/1998 | Purinton |
| 5,810,607 A | 9/1998 | Shih et al. |
| 5,819,406 A | 10/1998 | Yoshizawa et al. |
| 5,829,988 A | 11/1998 | McMillan et al. |
| 5,833,471 A | 11/1998 | Selna |
| 5,859,538 A | 1/1999 | Self |
| 5,876,219 A | 3/1999 | Taylor et al. |
| 5,879,172 A | 3/1999 | McKenna-Olson et al. |
| 5,892,245 A | 4/1999 | Hilton |
| 5,893,765 A | 4/1999 | Farnworth |
| 5,896,037 A | 4/1999 | Kudla et al. |
| 5,923,176 A | 7/1999 | Porter et al. |
| 5,982,635 A | 11/1999 | Menzies et al. |

* cited by examiner

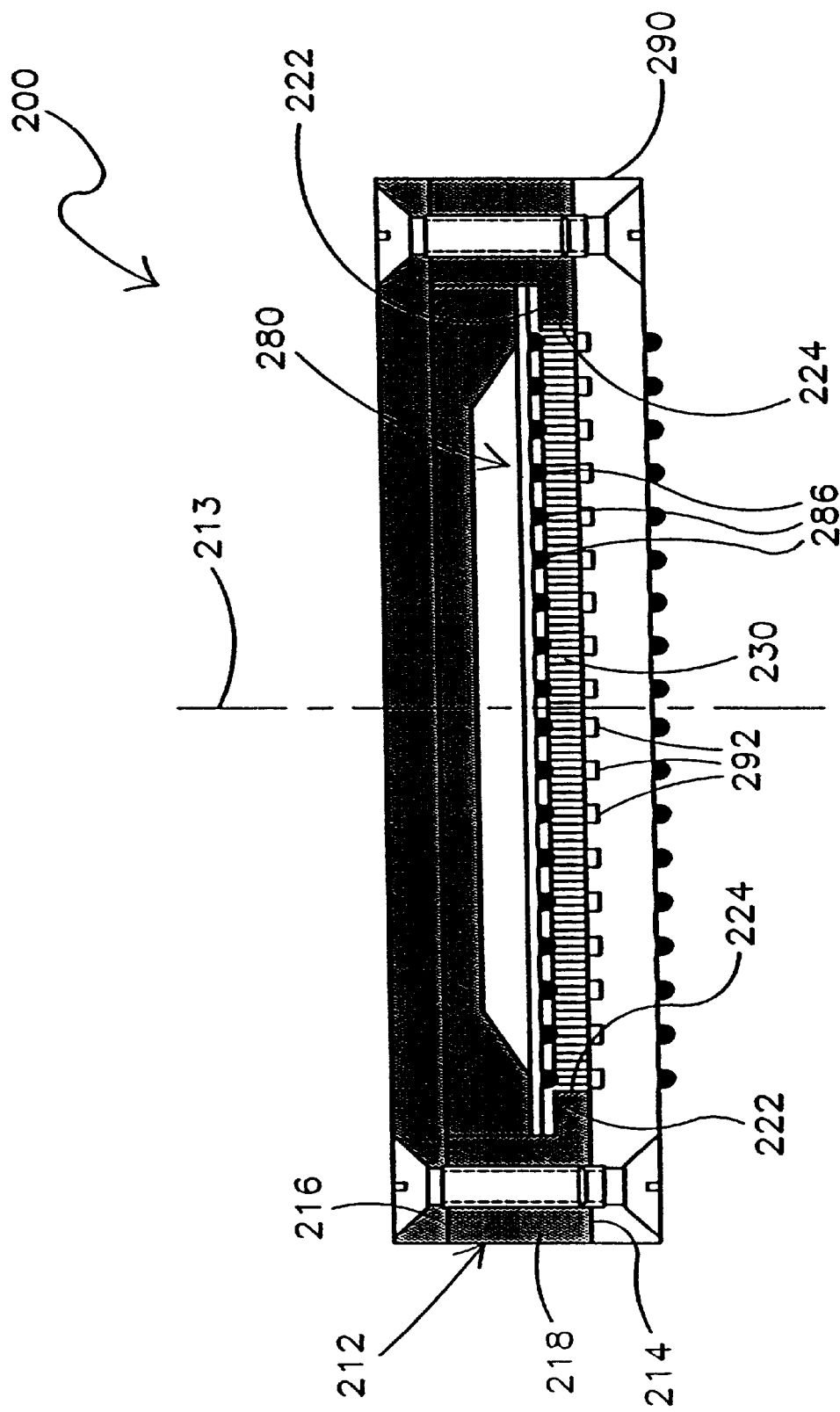

PACKAGED DEVICE ADAPTER ASSEMBLY

FIELD OF THE INVENTION

The present invention relates to electrical adapters. More particularly, the present invention pertains to adapters for packaged integrated circuit devices, e.g., ball grid array packages, flip chip packages, etc.

BACKGROUND OF THE INVENTION

Certain types of integrated circuit packages are becoming increasingly popular due to their occupancy area efficiency. In other words, they occupy less area on a target board on which they are mounted while providing a high density of contact terminals. For example, one such high density package type is a ball grid array package. Generally, ball grid array packages contain an integrated circuit having its die bond pads electrically connected to respective conductive solder spheres that are distributed on the bottom surface of the package in an array. A target printed circuit board typically has formed on its surface a corresponding array of conductive pads which are aligned with the array of solder spheres for electrically mounting the ball grid array package on the target board. The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging, e.g., ball grid array packages, provide a high density of terminals at a very low cost. Also, this packaging provides for limited lead lengths. The limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a ball grid array package mounted thereon, the designer must first electrically connect the solder balls on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with the packages soldered thereon.

Various adapters for ball grid array packages which electrically connect a ball grid array package to a target printed circuit board without requiring that the solder balls on the ball grid array package be fused to the target board are known. For example, one such adapter is shown in U.S. Pat. No. 5,892,245 to Hilton, issued Apr. 6, 1999 and entitled, "Ball Grid Array Package Emulator." However, the high density of terminals for certain packages, e.g., ball grid array packages, lead to various interconnect problems for adapters being used with such packages. For example, such a high density of terminals, e.g., solder spheres, of such packaged devices may lead to isolation problems between conductive elements of conventional adapters used for connecting the packages to the target board. Further, many adapters require the provision of structure on the target board for mechanically fastening an adapter thereto. For example, in many cases the target board is required to have holes defined therein for receiving fastening devices to mechanically mount the electrical adapter to the target board. Yet further, alignment of the contact terminals of the packaged device, e.g., solder spheres, to the contact pads of the target board may be problematic when an electrical adapter is used.

SUMMARY OF THE INVENTION

The present invention provides a packaged device adapter assembly preferably useable for high density integrated circuit packages, e.g., ball grid array packages, flip-chip packages, chip scale packages, etc. An adapter assembly according to the present invention for receiving a packaged device having a plurality of contact elements disposed on the surface thereof includes a perimeter wall member having a length along an adapter axis between a first end of the wall member and a second end of the wall member. A conductive element layer including arranged contact elements, e.g., a conductive elastomer layer or an array of contact elements isolated by insulative material, is positioned at the first end of the perimeter wall member orthogonal to the adapter axis. The perimeter wall member and the conductive element layer define a socket cavity to receive the packaged device. Generally, the plurality of contact elements of the packaged device are adjacent the conductive element layer. A cover member is positioned at the second end of the perimeter wall to close the socket cavity. The cover member is movable to allow the packaged device to be removed from the socket cavity. The adapter apparatus further includes a floating member that is moveable in the socket cavity and an actuator element operable to provide a force on the floating member such that a corresponding force is distributed to the packaged device when the packaged device is received in the socket cavity such that the plurality of contact elements thereof are in electrical contact with the arranged conductive elements.

In one embodiment of the adapter apparatus, the actuator element is associated with the cover member. For example, the actuator element may be a threaded element moveable in a threaded insert of the cover member. Further, the threaded element may include a heat sink head portion with a threaded portion extending therefrom.

In another embodiment of the apparatus, the floating member is a plate member having a surface configured as a function of a surface of the packaged device. The surface of the plate member is positioned in direct contact with the surface of the packaged device when the packaged device is received in the socket cavity.

In yet another embodiment of the apparatus, the perimeter wall member has an inner surface facing towards the adapter axis and an outer surface facing in an opposing direction. The outer surface of the perimeter wall member includes an adhesive retaining surface adjacent the first end thereof. In various embodiments, the adhesive retaining surface may include one or more channels located adjacent the first end of the perimeter wall, an additional adhesive material (e.g., double-sided tape) may be applied on the first end of the perimeter wall member, and the adhesive material applied to the adhesive retaining surface may also be in contact with a target board.

In another embodiment of the apparatus, the apparatus further includes an alignment structure positioned in the socket cavity adjacent the conductive element layer and adjacent the surface of the packaged device on which the plurality of contact elements are disposed to align the contact elements of the packaged device with contact pads on a target board when the adapter apparatus is mounted relative to the target board. For example, the alignment structure may include an alignment plate positioned orthogonal to the adapter axis and may include at least one opening defined therein to allow the contact elements of the packaged device to be in electrical contact with the arranged conductive elements. Yet further, for example, the alignment plate may include a plurality of openings with each opening corresponding to one of the plurality of contact elements disposed on the surface of the packaged device. Yet further, the alignment plate may include an outer surface positioned adjacent the perimeter wall member and an inner surface facing inward towards the adapter axis with the inner surface formed to include arc surface portions corresponding to certain perimeter solder spheres of a ball grid array package received in the socket cavity. In addition, the alignment structure may include a lip portion of the perimeter wall member extending inward towards the adapter axis at the first end of the perimeter wall member.

Another adapter apparatus according to the present invention for receiving a packaged device having a plurality of contact elements disposed on a surface thereof includes a perimeter wall member having a length along an adapter axis between a first end of the wall member and a second end of the wall member. The perimeter wall member has an inner surface facing towards the adapter axis and an outer surface facing in an opposing direction. The outer surface of the perimeter wall member includes an adhesive retaining surface adjacent to the first end thereof. The adapter apparatus further includes a conductive element layer including a plurality of arranged conductive elements positioned at the first end of the perimeter wall member orthogonal to the adapter axis. The perimeter wall member and the conductive element layer define a socket cavity to receive the packaged device with the plurality of contact elements of the packaged device in electrical contact with the arranged conductive elements. A cover member is positioned at the second end of the perimeter wall to close the socket cavity. The cover member is moveable to allow the packaged device to be removed from the socket cavity.

In one embodiment of the adapter apparatus, the adhesive retaining surface includes one or more channels located adjacent the first end of the perimeter wall. In yet another embodiment of the apparatus, an additional adhesive material is applied on the first end of the perimeter wall member, e.g., double-sided tape.

In yet another embodiment of the adapter apparatus, an adhesive material is applied to the adhesive retaining surface such that the adhesive material is also in contact with the target board. For example, the adhesive material may be an epoxy material.

Yet another adapter apparatus is described according to the present invention for receiving a packaged device having a plurality of contact elements disposed on a surface thereof. This adapter apparatus includes a perimeter wall member having a length along an adapter axis between a first end of the wall member and a second end of the wall member. A conductive element layer including arranged conductive elements is positioned at the first end of the perimeter wall member orthogonal to the adapter axis. The perimeter wall member and the conductive element layer define a socket cavity to receive the packaged device with the plurality of contact elements thereof in electrical contact with the arranged conductive elements. A cover member is positioned at the second end of the perimeter wall to close the socket cavity. The cover member is movable to allow the packaged device to be removed from the socket cavity. An alignment structure is further positioned in the socket cavity adjacent the conductive element layer and adjacent the surface of the packaged device on which the plurality of contact elements are disposed. The alignment structure aligns the contact elements of the packaged device with contact pads on a target board when the adapter apparatus is mounted relative to the target board.

In various embodiments of this adapter apparatus, the alignment structure may be an alignment plate positioned orthogonal to the adapter axis between the layer of arranged conductive elements and the surface of the packaged device in which the plurality of contact elements are disposed, the alignment plate may include at least one opening defined therein to allow the contact elements of the packaged device to be in electrical contact with the arranged conductive elements, the alignment plate may include a plurality of openings defined therein with each opening corresponding to one of a plurality of contact elements disposed on the surface of the packaged device, the alignment plate may include an outer surface positioned adjacent the perimeter wall member and an inner surface facing inward towards the adapter axis with the inner surface formed to include arc surface portions corresponding to certain perimeter solder spheres of a ball grid array package mounted in the socket cavity, or the alignment structure may include a lip portion of the perimeter wall member extending inward towards the adapter axis at the first end of the perimeter wall member.

BRIEF DESCRIPTION OF THE DRAWINGS

FIG. 3 is another alternate embodiment of a packaged device adapter assembly showing a particular alignment structure according to the present invention.

DETAILED DESCRIPTION OF THE EMBODIMENTS

Generally, packaged device adapter assemblies for use with packaged devices, e.g., high density devices, shall be described herein. Generally, a first illustrative packaged device adapter assembly 10 according to the present invention shall be described with reference to illustrative FIGS. 1A and 1B. Various other illustrative embodiments of packaged device adapter assemblies according to the present invention including features which may be included in combination with features or structure of the other assemblies as described herein shall be described with reference to FIGS. 2–7. One skilled in the art will recognize from the description herein, that the various illustrative embodiments described include some features or elements included in other illustrative embodiments and/or exclude other features.

However, a packaged device adapter assembly according to the present invention may include any combination of elements selected from one or more of the various embodiments as described herein with reference to FIGS. 1–7. For example, as will be readily apparent from the description below, an adhesive retaining surface described with reference to FIGS. 1A and 1B may be used with the alignment structure described with reference to FIGS. 2A and 2B. Further, for example, the cover member 460 described with reference to FIG. 5 may be used with one or more of the various adapter assembly embodiments described with reference to FIGS. 1A–1B, 2A–2B, 3 or 4.

Figure 1A:
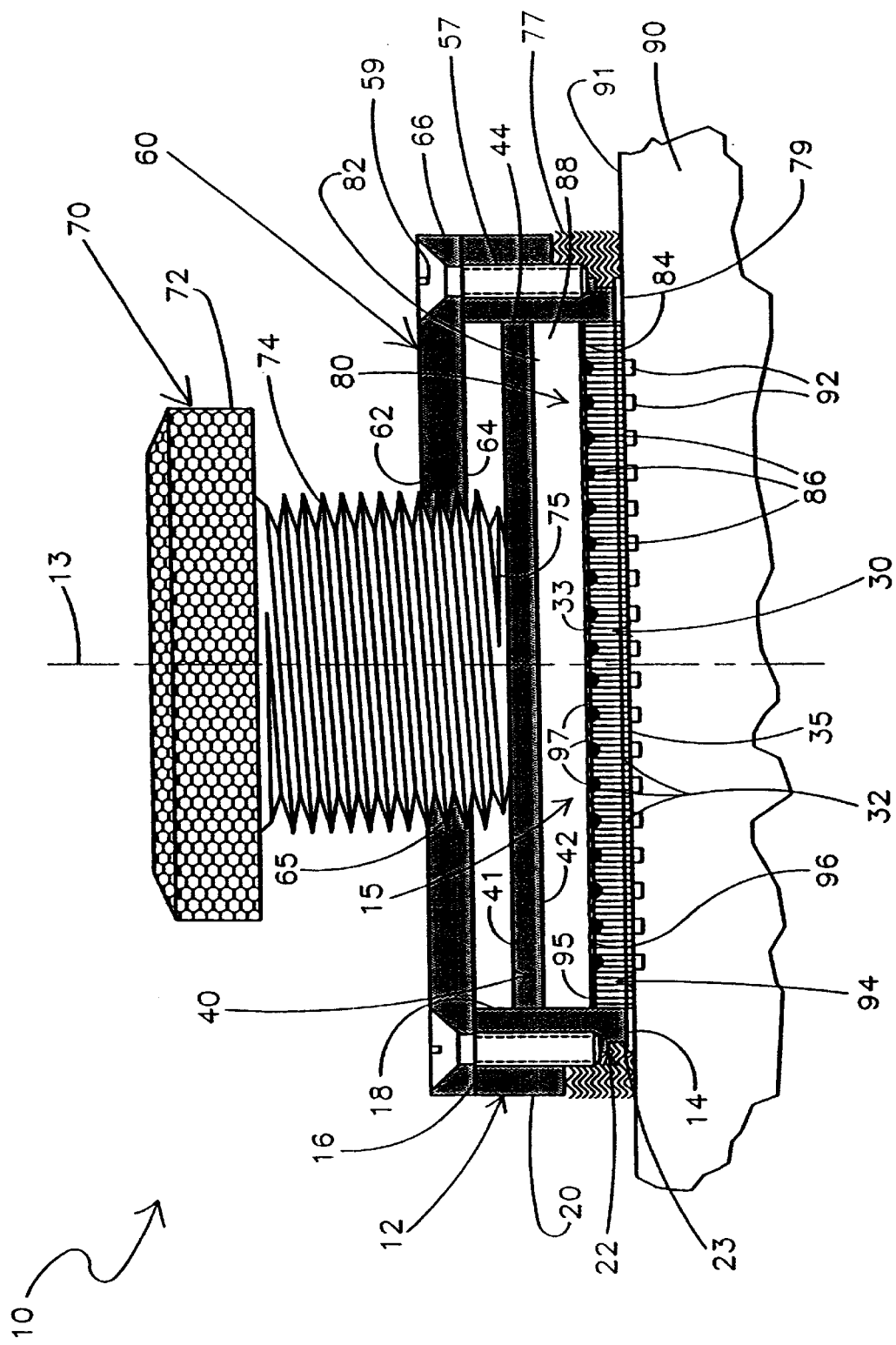
FIG. 1A is a cross-section side view of a packaged device adapter assembly according to the present invention mounted on a target board.
Figure 1B:
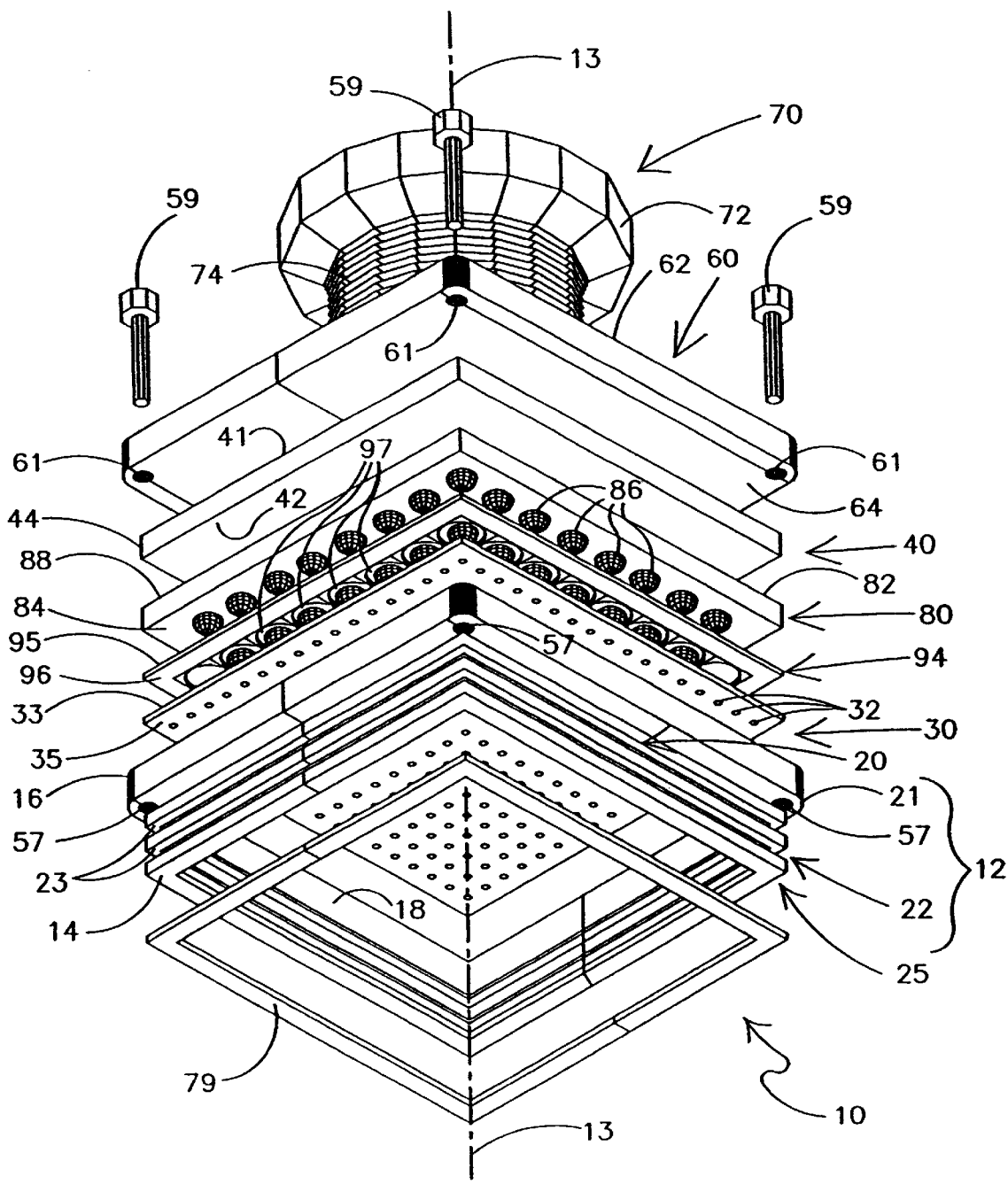
FIG. 1B is a bottom exploded perspective view of the packaged device adapter assembly of FIG. 1A.

FIGS. 1A and 1B show a cross-section side view and a bottom exploded perspective view, respectively, of an illustrative packaged device adapter assembly 10 for use with a packaged device 80 according to the present invention. Generally, the packaged device adapter assembly 10 is for mounting on a target board 90. The packaged device adapter assembly 10 includes a perimeter wall member 12 having a length along an adapter axis 13. Generally, the length of the perimeter wall member 12 extends between a first end 14 of the perimeter wall member 12 and a second end 16 of the perimeter wall member 12 and includes an inner surface 18 facing towards the adapter axis 13 and an opposing outer surface 20 facing away from the adapter axis 13.

The packaged device adapter assembly 10 further includes a conductive element layer 30 including a plurality of arranged conductive elements 32 therein, e.g., a conductive elastomer layer. The perimeter wall member 12 and the conductive element layer 30 including the plurality of arranged conductive elements 32 generally define a socket cavity 15 sized for receiving a packaged device 80 therein.

Generally, the packaged device 80 includes an upper surface 82 and a lower surface 84 in addition to an edge surface 88 extending therebetween at the perimeter of the packaged device 80. A plurality of contact elements 86 are disposed on the lower surface 84. Preferably, the contact elements 86 are distributed in an array along x and y axes orthogonal to the adapter axis 13. However, any arrangement of contact elements 86 may be accommodated according to the present invention.

The packaged device 80 may be any packaged device having a plurality of contact elements 86 disposed on a surface thereof. Preferably, the packaged device is a device having a high density of contact terminals, e.g., solder spheres, bumps, contact pads, leads, etc., disposed on a surface thereof. For example, the high density packaged device may be a ball grid array package as shown in FIG. 1A and in the various other illustrative embodiments shown in the other figures described herein. However, the packaged device 80 may also be, for example, a chip scale package, a flip chip package, a flat package, a quad flat package, a small outline package, a micro ball grid array package, or any other package having contact elements disposed on a surface thereof. Although the present invention is described herein with reference to a ball grid array package as illustrated in the figures, the present invention is in no manner limited to use of the illustrative adapter apparatus embodiments described herein with only ball grid array packages. Rather, the adapter assemblies and adapter concepts described herein may be used with any packaged device having contact elements disposed on a surface thereof.

Figure 5:
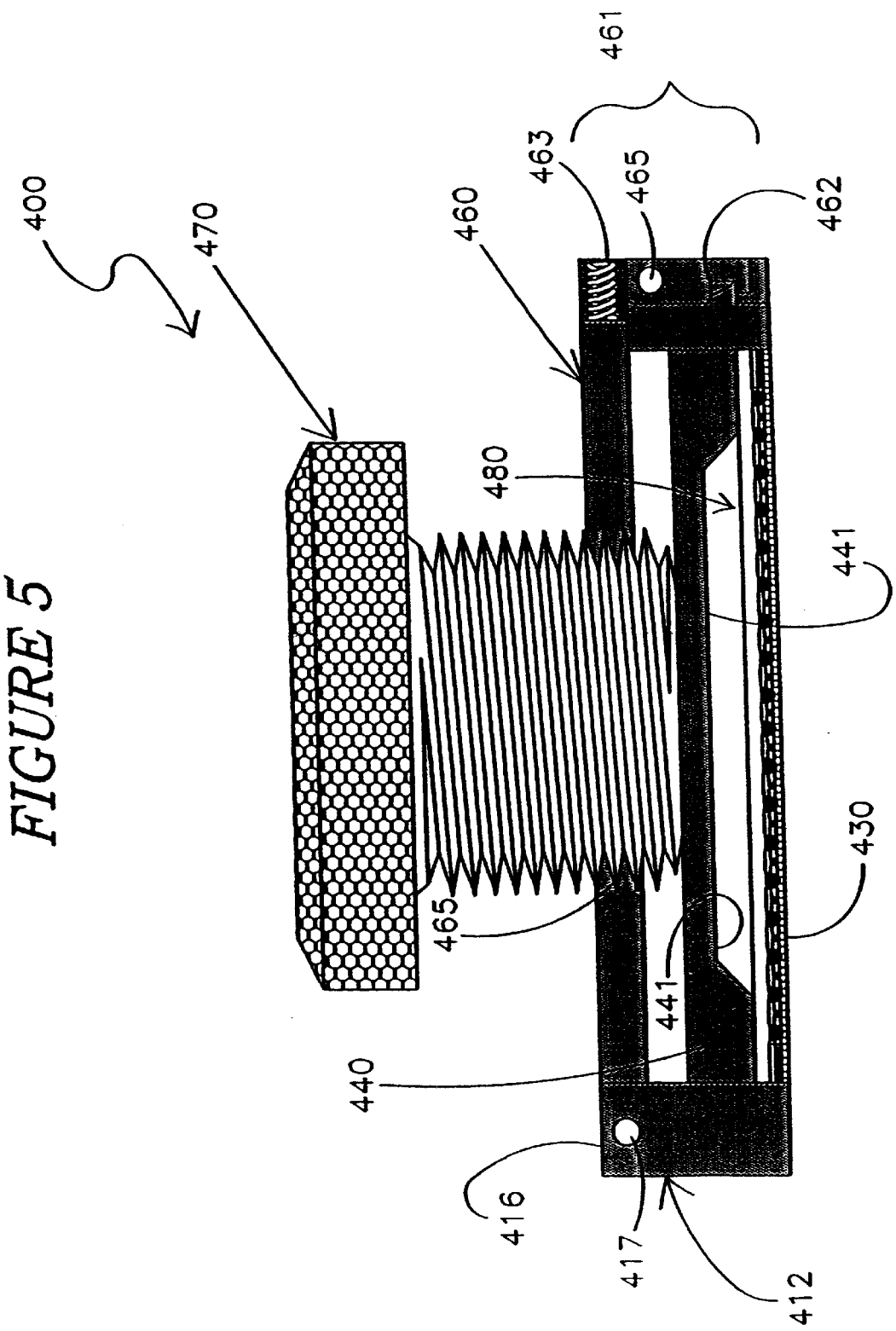
FIG. 5 is yet another alternate embodiment of a packaged device adapter assembly including a particular cover structure according to the present invention.

Further, the packaged device adapter assembly 10 includes a cover member 60 positioned at the second end 16 of the perimeter wall member 12 to close the socket cavity 15. The cover member 60 is generally movable, e.g., removable via fastening devices 59 as shown in FIG. 1A, moveable about a hinge axis 417 as shown in FIG. 5, etc. This allows the packaged device 80 to be removed from the socket cavity 15 and another packaged device placed therein. The packaged device adapter assembly 10 is generally used to provide electrical contact between the contact elements 86 of the packaged device 80 and contact pads 92 of the target board 90 via the arranged conductive elements 32 of conductive element layer 30, when the packaged device 80 is positioned in the socket cavity 15.

Figure 2A:
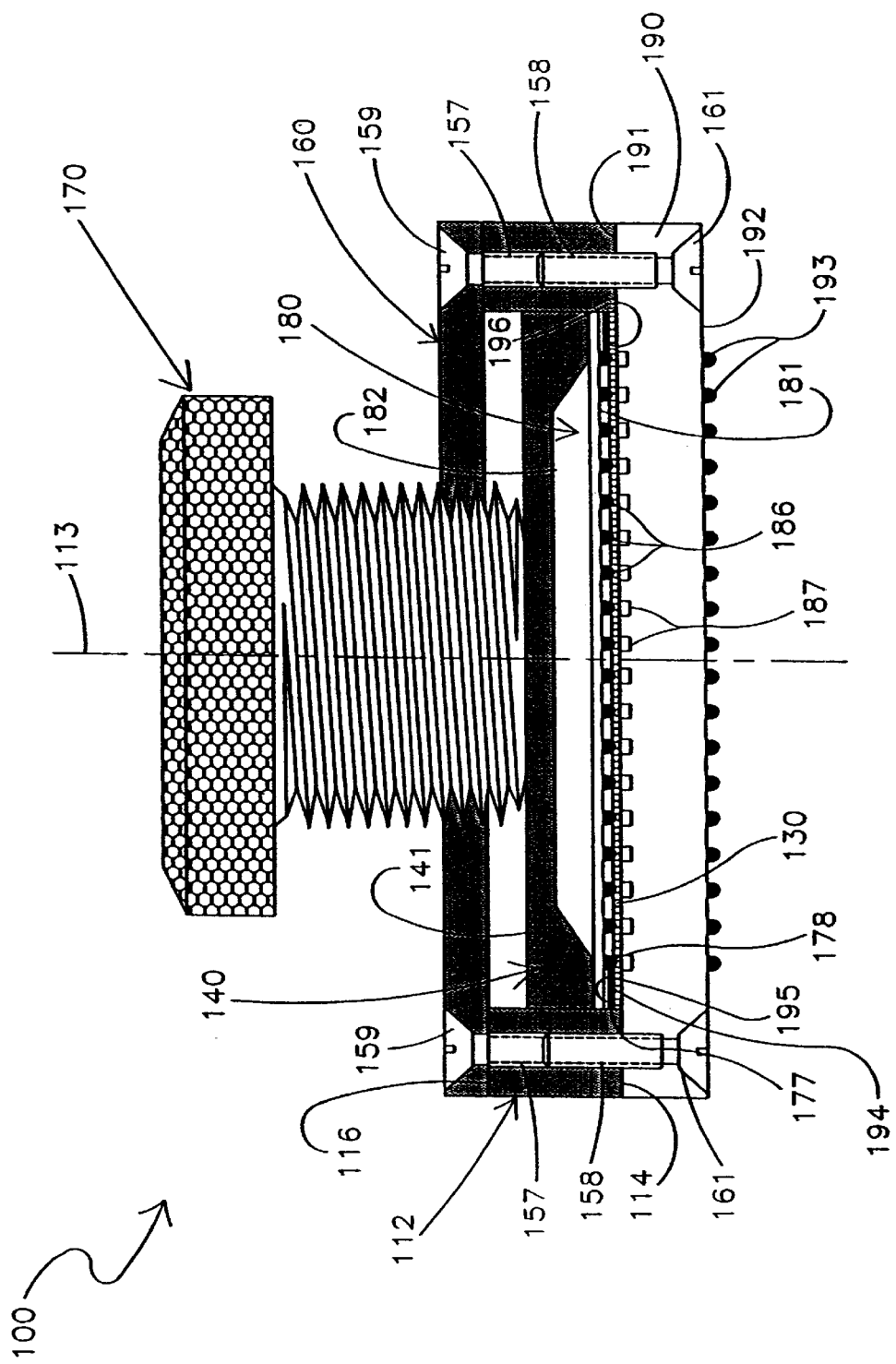
FIG. 2A is a cross-section side view of an alternate packaged device adapter assembly according to the present invention mounted on a target board.

The packaged device adapter assembly 10 further includes a floating member 40 as shown in FIGS. 1A and 1B. The floating member 40 is used in combination with an actuator element 70 to provide a distributed force on the packaged device 80 when received in the socket cavity 15 such that the contact elements 86 disposed on the lower surface 84 of the packaged device 80 are in effective electrical contact with the arranged conductive elements 32 of the conductive element layer 30. The floating member 40 preferably includes an upper surface 41 that is generally planer and orthogonal to the adapter axis 13 when the floating member 40 is positioned in the socket cavity 15. Further, the floating member 40 preferably includes a lower surface 42 that is configured as a function of the upper surface 82 of the packaged device 80. For example, as shown in FIG. 1A, lower surface 42 of the floating member 40 is generally planer and in direct contact with the planar upper surface 82 of a packaged device 80. However, as shown in FIG. 2A, the lower surface 142 of the floating member 140 is configured according to the upper surface 182 of the packaged device 180 and is not planer. However, in both cases, the lower surface 42, 142 of the floating member 40, 140 is in direct contact with the upper surface 82, 182 of the packaged device 80, 180. Further, as shown in FIG. 1A, the floating member 40 preferably includes an edge surface 44 extending between the upper surface 41 and the lower surface 42 at the perimeter of the floating member 40. The edge surface 44 lies adjacent, and may even be in contact with, the perimeter member wall 12 and is moveable relative thereto within the socket cavity 15.

The actuator element 70 may be any actuator element operable to apply a force on the upper surface 41 of the floating member 40. As a force is applied by the actuator element 70 to the upper surface 41 of the floating member 40, the force is distributed generally equally along the upper surface 82 of the packaged device 80. As such, an equivalent force is provided at each contact element 86, e.g., solder ball, for effective contact between each contact element 86 and one or more conductive elements 32, e.g., conductive strands of a conductive elastomer layer. Such a distributed force across the entire packaged device 80 reduces the potential application of excessive force on one part of the packaged device 80 versus another part thereof, e.g., the center versus the perimeter.

Preferably, the actuator element 70 is an element associated with the cover member 60. For example, the actuator element may be a spring element, a leaf spring, or any other flexible element capable of applying a force to the floating member 40 via the association with the cover member 70. Further, although not preferred, the cover member 70 itself may be used to apply a force to the floating member 40 such as by tightening the cover member directly down on the floating member 40 by fastening elements, e.g., screws 59.

Preferably, the actuator element 70 is a threaded element that includes a head portion 72 with a threaded portion 74 extending therefrom. Further, preferably, the cover member 60 includes a threaded insert 65 positionable along the axis 13 of the adapter assembly 10 for mating with the threaded portion 74 of the actuator element 70. The threaded portion 74 terminates in a generally planer surface 75. With the packaged device 80 in the socket cavity 15, the planer surface 75 is placed in direct contact with the upper surface 41 of the floating member 40 by turning the head portion 72 of the actuator element 70. As such, the actuator element 70 is adjustable to provide an effective force to the upper surface 41 of floating member 40 such that the distributed force is applied for effective electrical coupling of the contact elements 86 to the arranged conductive elements 32 of conductive element layer 30. With use of the actuator element 70 and the floating member 40, a suitable distributed force on the packaged device 80 can be achieved. The minimized load applied to the packaged device 80 and thus to the conductive elements 32 of the conductive element layer 30 allows for operation of the adapter assembly 10 over many insertion cycles as the conductive element layer 30 is not unnecessarily damaged by the force applied to the packaged device 80 in order to achieve contact between all of the contact elements 86 and the arranged conductive elements 32.

Preferably, the floating member 40 is formed of a heat conductive material, e.g., aluminum, to provide heat sinking capability. Further, actuator element 70 and the perimeter wall member 12 and cover 60 are formed of such heat sinking material. In such a manner, the elements that form the socket cavity 15 which provide electrical coupling of the packaged device 80 to a target board 90 also function to dissipate heat away from the packaged device 80 when the packaged device 80 is operable. This is particularly important for high density packaged devices such as ball grid array packages, chip scale packages, flip-chip packages, etc., in that the packaged device 80 tends to operate with greater heat output.

As can be readily seen from FIG. 1A, the floating member 40 is sized and configured such that edge 44 thereof is in moveable contact with inner surface 18 of the perimeter wall member 12 which allows heat conduction therethrough and away from the packaged device 80. Likewise, the contact between the actuator element 70, such as a screw formed of aluminum, provides for heat conduction from the threaded portion 74 (which is in direct contact with the floating member 40) to the head portion 72 of the actuator element 70. The head portion 72 is sized and configured to provide a large surface area for heat dissipation therefrom.

The perimeter wall member 12 includes an inner surface 18 facing inward towards the adapter axis 13 and an outer surface 20 facing in an opposing direction generally away from the adapter axis 13. The outer surface 20 includes an adhesive retaining surface 22 adjacent the first end 14 of the perimeter wall member 12. Generally, any adhesive retaining surface 22 which provides for mounting the adapter assembly 10 to the target board 90 without the use of any particular adaptation of the target board, e.g., the drilling of holes therein, the attachment of structure thereto, etc., may be used according to the present invention.

Preferably, the adhesive retaining surface 22 includes a plurality of grooves or channels 23 for receiving adhesive material 77, e.g., an epoxy, and is retained therein and which is also positioned adjacent to target board 90 such that the adapter assembly 10 is affixed to the target board 90 when the adhesive material is set or cured. The channels may be configured and sized in various manners, e.g., vertical channels parallel to the adapter axis 13, horizontal channels, angled channels, curved channels, etc. However, any adhesive retaining surface 22 may be used according to the present invention. For example, the adhesive retaining surface 22 may be an abrasive surface capable of retaining an adhesive material thereon, may be a ribbed surface, or may be any other surface for retaining an adhesive material thereon.

The adhesive material 77 may be any adhesive material that is suitable for being received by the adhesive retaining surface 22, such as in grooves 23, and which is suitable for attaching or mounting the adapter assembly 10 to the target board 90 by contact with the adhesive retaining surface 22 and the target board surface 91. For example, the adhesive material 77 may be an epoxy, may be a tape product, or may be any other adhesive material suitable for performing such retention or fixation.

As shown in FIG. 1B, the perimeter wall member 12 generally includes a wall member base 21 and an adhesive retaining portion 25. As such, this wall member 12 may be formed of two separate pieces or it may be formed as a single piece element. It will be recognized that other elements formed herein made also be made of a single or multiple layer structure. For example, the floating member 40 may be formed of one or more layers.

The adapter assembly 10, as more clearly shown in FIG. 1B, is formed in a substantially square configuration. However, one skilled in the art will recognize that the elements used in forming the packaged device adapter assembly 10 may include elements for forming an adapter assembly configured as a rectangle, a circle, or any other configuration sized to accommodate a packaged device received in a socket cavity therein. As such, one skilled in the art will recognize that the present invention is not limited to any particular shape of adapter assembly but is limited only as described in the appended claims.

The perimeter wall member 12 further has affixed thereto an additional adhesive material 79 to temporarily position an adapter assembly 10 on a target board 90 as will be described further below prior to affixing the adapter assembly 10 to the target board 90 using the adhesive material 77 on the adhesive retaining surface 22 and the target board 90. For example, the additional adhesive material 79 may include double-sided tape or any other like adhesive.

The cover member 60 of the packaged device adapter assembly 10 may be configured in various manners. The cover member 60 is used to close the socket cavity 15 and includes various other elements associated therewith for facilitating other functionality. For example, as previously described herein, cover member 60 is integrated with a threaded insert 65 for receiving the threaded portion 74 of the actuator element 70 used in applying a direct force to floating member 40. Further, cover member 60 as shown in FIG. 1A includes openings 61 for receiving corresponding fastening elements 59, e.g., screws, to affix cover member 60 to the perimeter wall member 12. In such an embodiment, the perimeter wall member 12 includes inserts 57 for retaining the fastening elements 59 therein. For example, as shown in FIG. 1A, inserts 57 may be threaded inserts for retaining threaded screw portions of screws 59 to attach cover member 60 to the perimeter wall member 12.

However, the cover member 60 may also be configured as a latchable hinge cover 460 as shown in FIG. 5, e.g., a ZIF type or clam-type lid. FIG. 5 is a cross-section side view of a packaged device adapter assembly 400 which includes a perimeter wall member 412 and a conductive element layer 430 to form a socket cavity for receiving a packaged device 480 in a manner similar to that as shown in FIG. 1A. However, instead of a screw down cover member 60 as shown in FIG. 1A, a latchable hinge cover member 460 is shown in FIG. 5. The latchable hinge cover member 460 is attached at the upper end 416 of the perimeter wall member 412 by hinge mechanism 417. The latchable hinge cover 460 further includes a latchable closure mechanism 461 to provide for latching of the cover member 460 to the perimeter wall member 412. For example, as shown in FIG. 5, the latchable closure mechanism 461 includes a spring 463 coupled to a latch member 462 which is coupled at hinge 465 for operation with spring 463. One skilled in the art will recognize that this is just one embodiment of a latchable closure mechanism 461 useable in accordance with the present invention and that any closure mechanism for a cover member that is not entirely removed to allow removal of a packaged device from socket cavity 15 may be used according to the present invention.

Also as shown in FIG. 5, the hinged latchable cover 460 includes a threaded insert 465 for receiving the heat sink screw actuator 470. Further, also as shown in FIG. 5, the lower surface 441 of floating member 440 used therein is sized in accordance with the packaged device 480 such that the distributed force from the actuator element 470 is effectively provided to the packaged device 480.

Further with reference to FIGS. 1A and 1B, the conductive element layer 30 includes an upper surface 33 and a lower surface 35. The arranged conductive elements 32 extend from the upper surface 33 to the lower surface 35 through insulative material to provide isolated conductive paths therethrough. The upper surface 33 is configured to allow contact between the contact elements 86 of the packaged device 80 and the conductive elements 32 arranged therein and the lower surface 35 is configured to allow contact between the conductive elements 32 and the contact pads 92 of the target board 90.

The conductive element layer 30 including the arranged conductive elements 32 is preferably a conductive elastomer layer. For example, the conductive elastomer layer may be formed of a z-axis elastomer material or a slanted axis conductive elastomer material. For example, such material may be that as described in U.S. Pat. No. 4,923,739 to Jin et al., issued May 8, 1990 and entitled "Composite Electrical Interconnection Medium Comprising a Conductive Network, And Article, Assembly, and Method;" that as described in U.S. Pat. No. 4,754,546 to Lee et al., issued Jul. 5, 1988 and entitled "Electrical Connector for Surface Mounting and Method of Making Thereof;" that as described in U.S. Pat. No. 4,729,166 to Lee et al., issued Mar. 8, 1988 and entitled "Method of Fabricating Electrical Connector for Surface Mounting;" that as described in U.S. Pat. No. 4,668,957 to Spohr, issued May 26, 1987 and entitled "Amorphous Glass Matrix Containing Aligned Microscopically Thin Metal Conductors;" or may be any other conductive elastomer material such as that available from Shin-Etsu Polymer America Inc. (Union City, Calif.) under the trade designation GB-Matrix.

Although the conductive element layer 30 is preferably a conductive elastomer material having conductive elements or material arranged therein, various other layers which include arranged conductive elements 32 therein may also be used according to the present invention. For example, the arranged conductive elements 32 may include formed conductive element structures, stamped conductive elements structures, or any other conductive material for connecting contact elements 86 to contact pads 92 on target board 90, e.g., pins, springs, pogo pins, or fizz buttons.

As shown in FIG. 1A, the sizing of various elements therein are used to align the contact elements 86, e.g., solder spheres, of packaged device 80 with the contact pads 92 of the target board 90. For example, the inner surface 18 of perimeter wall member 12 may be configured to set edge 88 of the packaged device 80 in contact therewith to assist in alignment of the contact elements 86 with the contact pads 92. However, preferably, the adapter assemblies described herein include additional alignment structure to precisely position the packaged device 80 over the contact pads 92 of target board 90 in addition to the various alignment functionality already provided by the perimeter wall member 12. The alignment structure, such as a precise spacer structure, allows for easy and reliable connection of the contact elements 86 of packaged device 80 to the contact pads 92 via the conductive element layer 30 including the arranged conductive elements 32. Various alignment structures shall be described with reference to FIGS. 1A–1B, 2A–2B, 3, and 4.

As shown in FIG. 1A with regard to the packaged device adapter assembly 10, the alignment structure is provided by an alignment plate 94 positioned orthogonal to the adapter axis 13 between the upper surface 33 of the conductive element layer 30 and the lower surface 84 of the packaged device 80 on which the plurality of contact elements 86 are disposed. Preferably, the alignment plate 94 includes a planar upper surface 95 adjacent to lower surface 84 of the packaged device 80 and a planar lower surface 96 adjacent to upper surface 33 of conductive element layer 30. The alignment plate 94 may or may not be in direct contact with adjacent surfaces.

The alignment plate 94 is a planer plate structure having a plurality of openings 97 defined therein. Each opening 97 corresponds to one of the contact elements 86 disposed on the lower surface 84 of the packaged device 80. For example, when the packaged device 80 is a ball grid array having a plurality of solder spheres disposed on a surface thereof, each opening 97 as shown in FIG. 1A corresponds to one of the solder spheres. In this manner, when the packaged device 80 is positioned in the socket cavity 15, the contact elements 86 are precisely positioned on the target board 90 as the openings 97 defined in the alignment plate 94 are sized and configured to directly align the contact elements 86 with the contact pads 92.

Figure 2B:
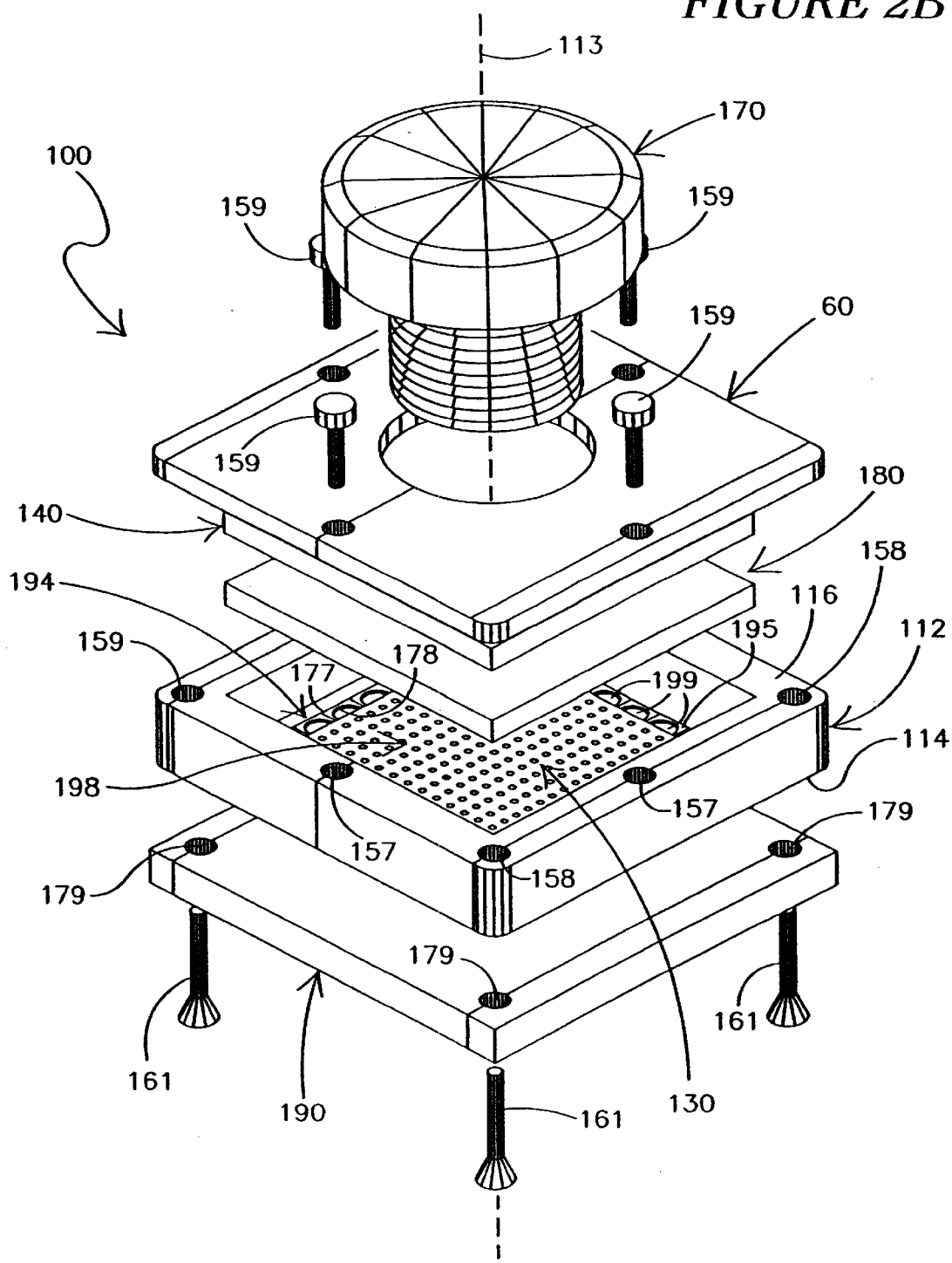
FIG. 2B is a top exploded perspective view of the packaged device adapter assembly shown in FIG. 2A.

In an alternate embodiment, adapter assembly 100 shown in FIG. 2A includes perimeter wall member 112 and conductive element layer 130, e.g., a conductive elastomer layer, which define a socket cavity wherein packaged device 180 is received in a manner like that as described with reference to FIG. 1A. The alignment structure for providing precise alignment of contact elements 186 with contact pads 187 of target board 190 is provided by alignment plate 194. Alignment plate 194 includes an upper surface 195 adjacent the lower surface 181 of packaged device 180 and a lower surface 196 adjacent to the conductive element layer 130. As shown in FIGS. 2A and 2B, the alignment plate 194 includes a single opening 198 defined therein for precisely positioning contact elements 186 of the packaged device 180 relative to the contact pads 187 of target board 190. The alignment plate 194 includes an outer surface 177 about the outer perimeter of the alignment plate 194 which is adjacent, and preferably in contact with the perimeter wall 112, and includes an inner surface 178 about the inner perimeter of the alignment plate 194 defining opening 198. The inner surface 178 of the alignment plate 194 includes arc portions 199 extending about the inner perimeter. The arc portions 199 correspond to certain perimeter contact elements 186 (e.g., solder spheres of a ball grid array package). With use of alignment plate 194, by aligning the outer perimeter solder balls of contact elements 186 as shown in FIG. 2A, the remainder of the solder balls are aligned with the contact pads 187 of the target board 190.

Figure 4:
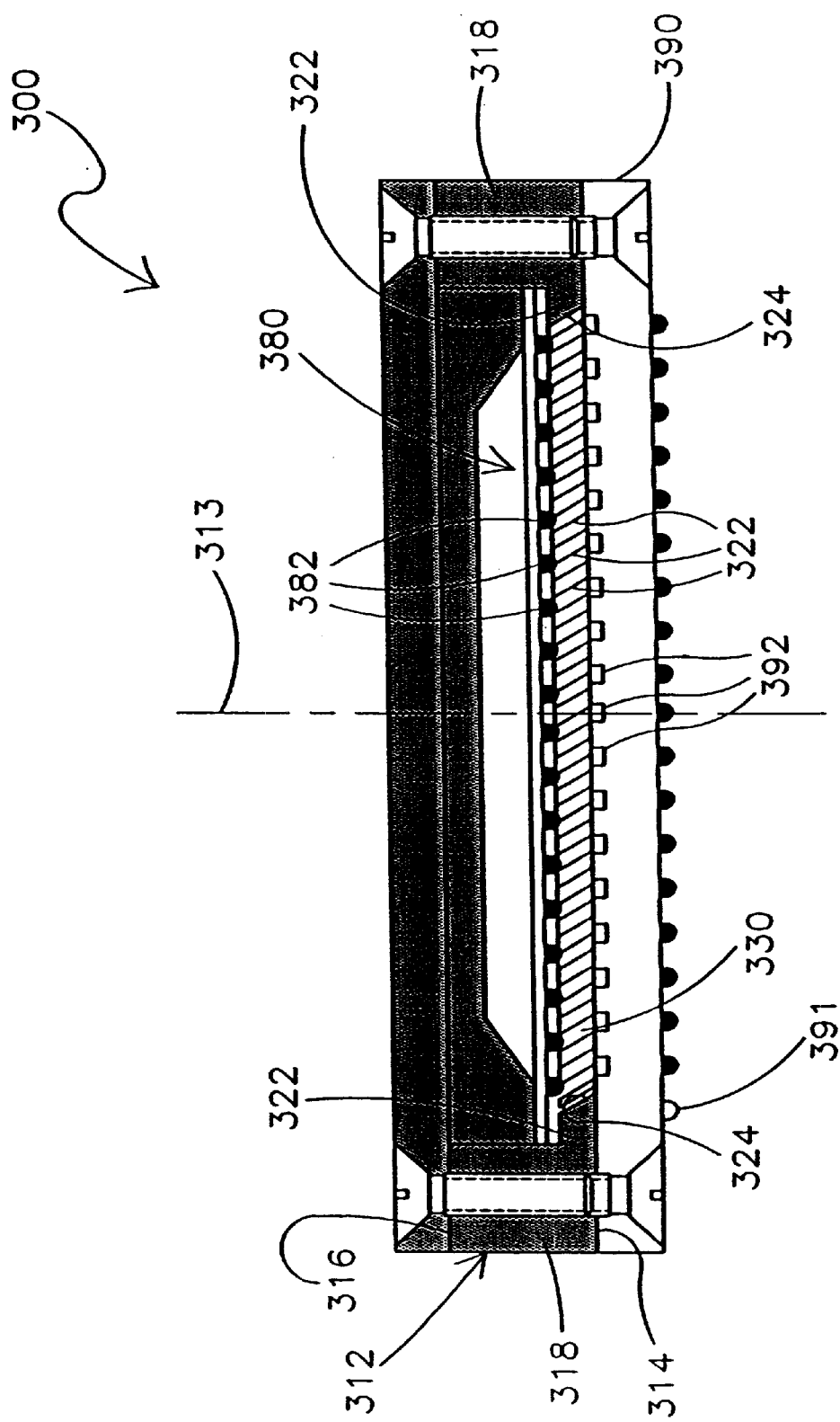
FIG. 4 is yet another alternate embodiment of a packaged device adapter assembly showing another alternate alignment structure according to the present invention.

Alignment structures for precise positioning of contact elements of a packaged device may also be provided by extensions from the perimeter wall member of the adapter assembly as shown in the adapter assembly embodiments of FIGS. 3 and 4. For example, as shown in FIG. 3, adapter assembly 200 includes a perimeter wall member 212 having a length along adapter axis 213 between a first end 214 and second end 216 of the perimeter wall member 212. Generally, the perimeter wall member 212 forms a socket cavity with a conductive element layer 230 for receiving a packaged device 280 therein. The adapter assembly 200 is substantially like the assembly shown in FIG. 2 except without the actuator element.

The perimeter wall member 212 includes a first wall portion 218 which lies generally parallel to the adapter axis 213. A second wall portion 222 extends adjacent the lower end 214 of the perimeter wall member 212 inward toward adapter axis 213. Preferably, the second wall portion 222 extends inward generally orthogonal to the adapter axis 213. This second wall portion 222 forms a lip for providing alignment of the contact elements 286 of packaged device 280 with contact pads 292 of target board 290. The second wall portion 222 terminates at end surface 224 which is adjacent the conductive element layer 230, e.g., a conductive elastomer layer, and generally parallel to the adapter axis 213 to accommodate a conductive elastomer layer that has z-axis conductive elements therein. In such a manner, the solder balls 286 of packaged device 280 are aligned to contact pads 292 of target board 290 through a desired number of z-axis conductive elements embedded in conductive elastomer layer 230.

The alignment structure shown in adapter assembly 300 of FIG. 4 is provided in a manner similar to that shown and described with reference to FIG. 3. However, the extension of the perimeter wall member 312 accommodates the use of a conductive elastomer layer 330 having slanted conductive elements 322 embedded therein. As shown in FIG. 4, adapter assembly 300 includes perimeter wall member 312 having a length along adapter axis 313 between a first end 314 and a second end 316. The perimeter wall member 312 and a conductive elastomer layer 330 form a socket cavity for receiving a packaged device 380 therein. Generally, the perimeter wall member 312 includes a first wall portion 318 which lies generally parallel to adapter axis 313. Further, the perimeter wall member 312 includes a second wall portion 322 extending generally orthogonal to adapter axis 313 and first wall portion 318 and which extends therefrom towards the axis 313. The second wall portion 322 terminates at a surface end 324 that is adjacent the conductive elastomer layer 330 and at an angle relative to the adapter axis 313. The angle is determined at least in part by the angle of the slanted conductive elements embedded in the conductive elastomer layer 330. In such a manner, the contact elements 382 disposed on a surface of packaged device 380 can be aligned with contact pads 392 of target board 390 through a desired number of angled conductive elements 322 embedded in conductive elastomer 330. As shown in this particular embodiment, with the adapter assembly 300 mounted to target board 390, dummy spheres 391 may be used to balance the target board 390 relative to the adapter assembly 300. In other words, the number of solder spheres on the lower surface of target board 390 are made symmetrical about adapter axis 313.

The adapter assemblies as described herein may be mounted relative to various target boards as illustrated generally in FIG. 1A by target board 90. The target board 90 may be any substrate including contact pads arranged thereon for electrical connection with the adapter assembly 10. For example, the target board may be a printed circuit board including various other components mounted thereon or may be a surface mountable substrate as shown and described with reference to FIG. 2A.

As shown in FIG. 2A, the target board 190 includes an upper surface 191 having a plurality of contact pads 187 disposed thereon for electrical contact with conductive elastomer layer 130. A plurality of surface mountable solder spheres 193 are disposed on lower surface 192, e.g., arranged in an array like solder balls 186. The contact pads 187 are electrically coupled to solder spheres 193 through use of conductive traces or any other. conductive elements generally used to provide electrical contact between conductive elements disposed on opposing surfaces of a substrate. Further, for example, the target board 190 may be formed of FR4 material and printed with conductive traces as performed using conventional printed circuit board fabrication techniques.

As shown in FIG. 2A, the adapter assembly 100 is mounted to target board 190 in a manner unlike that shown in FIG. 1A. As shown in FIG. 2A, target board 190 includes a plurality of openings 179 defined therein for receiving fastening devices 161, e.g., screws. The perimeter wall member 112 of adapter assembly 100 includes inserts 158, e.g., threaded inserts, for mating with fastening devices 161. As such, the target board 190 is mounted adjacent the first end 114 of perimeter wall member 112 by insertion of fastening elements 161 through openings 179 defined in target board 190 and coupled with threaded inserts 158 within perimeter wall member 112.

Figure 6:
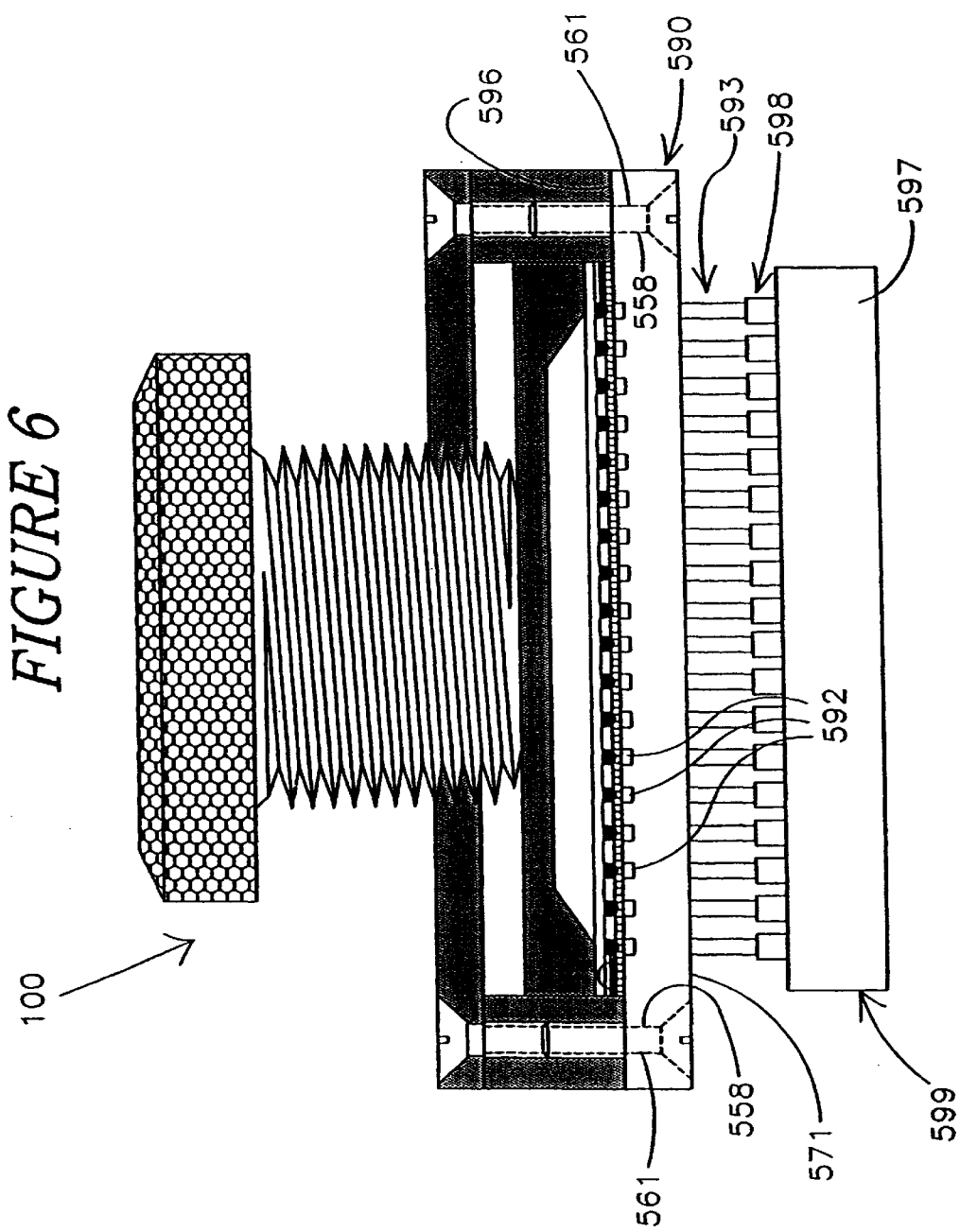
FIG. 6 shows a packaged device adapter assembly similar to that shown in FIG. 2A and further including a particular embodiment of a target board useable with the adapter assembly according to the present invention.
Figure 7:
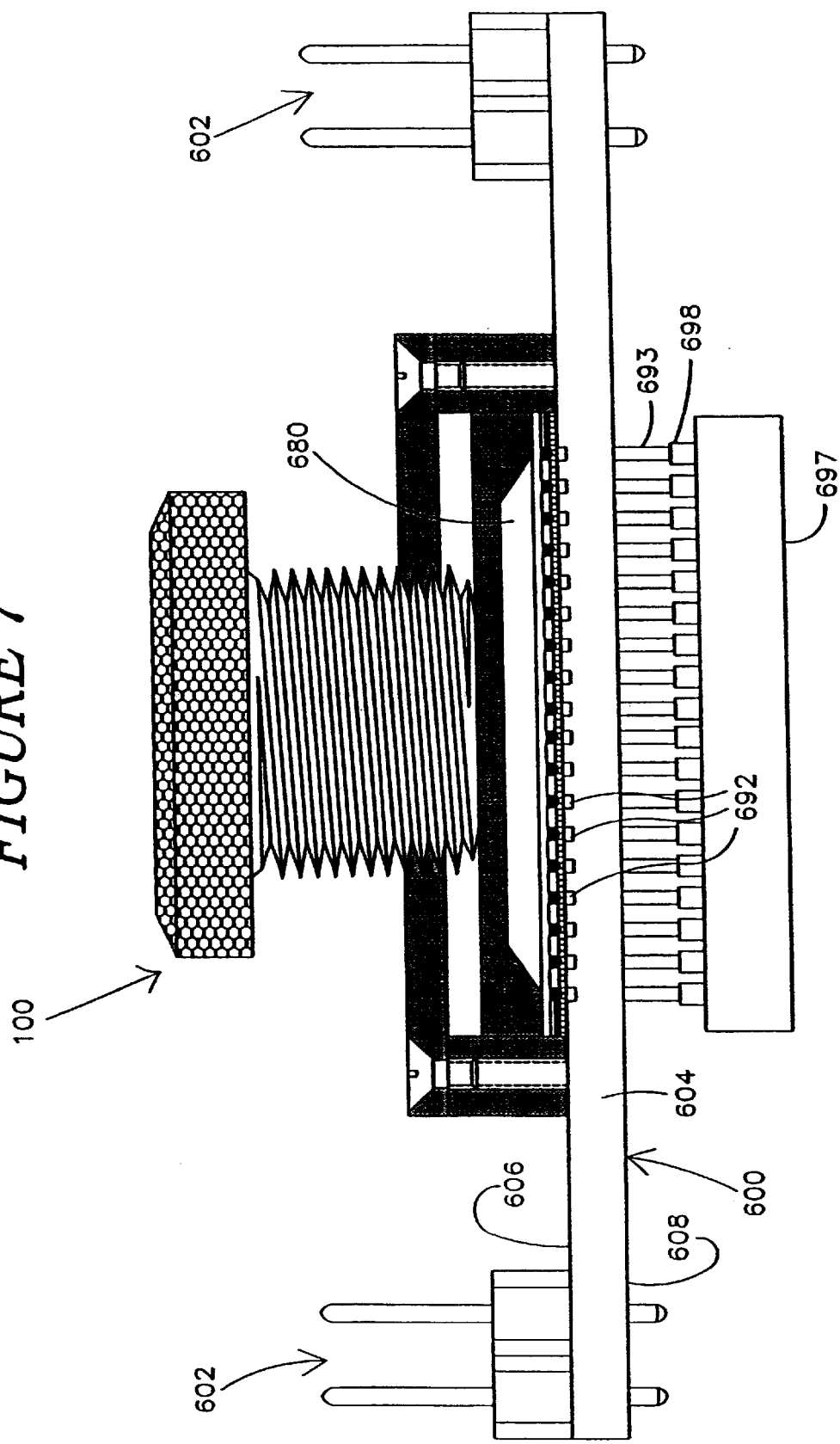
FIG. 7 also shows a packaged device adapter assembly similar to that shown in FIG. 2A in addition to yet another alternate embodiment of a target board useable with the adapter assembly according to the present invention.

The target board upon which the adapter assemblies are mounted may further include other types of target boards such as that shown in FIGS. 6 and 7. The adapter assemblies shown in FIGS. 6 and 7 are substantially identical to the adapter assembly 100 as shown in FIG. 2A except that the alignment plate used in FIGS. 6 and 7 is an alignment plate like that shown in FIG. 1A.

As shown in FIG. 6, the adapter assembly 100 is mounted relative to target board 590. Target board 590 includes openings 558 defined therein for attachment of the target board 590 to the adapter assembly 100 using fastening devices 561 in a manner similar to that shown in FIGS. 2A–2B. The target board 590 further includes male pins 593 extending beyond the lower surface 571 and electrically connected to the contact pads 592 disposed on the upper surface 596 thereof. As such, the male pin elements 593 may be used with female socket elements 598 extending from a substrate body 597 of an additional adapter apparatus 599.

As shown in FIG. 7, the adapter assembly 100 is mounted relative to target board 600. Target board 600 includes male pin elements 693 electrically connected to contact elements 692 disposed on upper surface 606 of target board 600. Male pin elements 693 extend beyond lower surface 608 of the target board 600 for mating with female socket elements 698 of another adapter apparatus or device 697. Further, the target board 600 includes conductive traces from contact pads 692 to test probes 602 for use in providing testing of packaged device 680 or a circuit board having other functionality (not shown) mounted relative to the adapter assembly, e.g., via the adapter apparatus 697.

As such, and as described in FIGS. 6 and 7, the target board may include a male or female pin interface at the lower surface thereof, the target board may be surface mountable such as when solder balls are mounted at a lower surface thereof, test probes may be integrated with the target board, or any other target board may be mounted relative to the adapter assemblies as described herein.

The adapter assemblies described herein are preferably very small, e.g., 0.2 inches larger than the actual packaged device mounted in the socket cavity thereof. Further, the elements of the adapter assembly are preferably formed of heat conductive material such that heat can be dissipated away from the packaged device mounted in the socket cavities thereof. By providing conductive elements that have a relatively short length along the axis of the adapter assembly to connect the contact elements of the packaged device to a target board, very high speed applications can be performed. The adapter assembly is generally very robust in that it does not lose connections very easily because of the distributed force applied on the packaged device mounted within the adapter assembly. Further, very high density packaged devices can be accommodated, particularly with use of a conductive elastomer layer, and yet further, unlimited number of insertion cycles may be accomplished with replacement of the conductive elastomer as needed.

A method of assembling the adapter assembly 10 shall be further described with reference to FIGS. 1A and 1B. Such techniques may be utilized with any of the other adapter assemblies described herein and it will be recognized that any number of various methods of assembly may be used and that the present invention is not limited to the method described herein. Preferably, adapter assembly 10 is assembled in the following manner. First, the alignment plate 94 is positioned on target board 90 with the openings defined in the alignment plate 94 aligned with the contact pads 92 of the target board 90. The double-sided tape 79 is then positioned about the perimeter of the alignment plate 94. The alignment plate 94 is then removed for later use.

Thereafter, perimeter wall member 12 is positioned on the double-sided tape 79 to initially fasten at least a portion of the adapter assembly 10 to the target board 90. The conductive element layer 30, e.g., a conductive elastomer layer, is then positioned within the perimeter wall member 12 and adjacent the double-sided tape 79 to form cavity 15 in which the packaged device 80 may be placed. Alignment plate 94 is then positioned over conductive element layer 30 and thereafter packaged device 80 is positioned within socket cavity 15. Floating member 40 is then positioned within socket cavity 15 adjacent to upper surface 82 of packaged device 80 and cover member 60 is mechanically coupled to perimeter wall member 12 via suitable fastening elements 59. Thereafter, actuator element 70 is threaded into threaded insert 65 of cover member 60 and a force is applied via the actuator element 70 to the upper surface 41 of floating member 40 such that contact elements 86 of packaged device 80 are in effective contact with conductive elements 32 of the conductive element layer 30. In such a manner, precise alignment of the contact elements 86 with the contact pads 92 is accomplished. It will be recognized that adhesive material 77 may be used to mount the assembly 10 to the target board at any time after the perimeter wall member 12 is positioned on the additional adhesive material 79. Preferably, the adhesive material 77 is placed in contact with the adhesive retaining surface 22 and an area of the target board 90.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative adapter assembly embodiments may be provided which utilize various combinations of the elements described herein. Various modifications of the illustrative embodiments, as well as additional embodiments of the invention and combinations of various elements herein, will be apparent to persons skilled in the art upon reference to this description. It is therefore contemplated that the patented claims will cover any such modifications or embodiments that may fall within the scope of the present invention as defined by the accompanying claims.

What is claimed is:

1. An adapter apparatus for receiving a packaged device having a plurality of contact elements disposed on a surface thereof, the apparatus comprising:

a perimeter wall member having a length along an adapter axis between a first end of the wall member and a second end of the wall member;

a conductive element layer including a plurality of arranged conductive elements, the conductive element layer positioned at the first end of the perimeter wall member orthogonal to the adapter axis, wherein the perimeter wall member and the conductive element layer define a socket cavity to receive the packaged device with the plurality of contact elements thereof adjacent the conductive element layer, wherein the conductive element layer is a conductive elastomer layer;

a cover member positioned at the second end of the perimeter wall member to close the socket cavity, wherein the cover member is movable to allow the packaged device to be removed from the socket cavity;

a floating member movable in the socket cavity;

an alignment structure positioned in the socket cavity adjacent the conductive element layer and adjacent the surface of the packaged device on which the plurality of contact elements are disposed to align the contact elements of the packaged device with contact pads on a target board when the adapter apparatus is mounted relative to the target board, wherein the alignment structure comprises:

an alignment plate positioned ortbogonal to the adapter axis between the conductive element layer and the surface of the packaged device on which the plurality of contact elements are disposed, wherein the alignment plate comprises at least one opening defined therein to allow the contact elements of the packaged device to be in electrical contact with the arranged conductive elements of the conductive element layer; and a lip portion of the perimeter wall member extending inward towards the adapter axis at the first end of the perimeter wall member terminating in a surface used for positioning the conductive elastomer layer; and an actuator element operable to provide a force on the floating member such that a corresponding force is distributed to the packaged device when received in the socket cavity such that the plurality of contact elements are in electrical contact with the arranged conductive elements of the conductive element layer.

2. The apparatus of claim 1, wherein the actuator element is associated with the cover member.

3. The apparatus of claim 2, wherein the actuator element is a threaded element movable in a threaded insert of the cover member.

4. The apparatus of claim 3, wherein the threaded element includes a heat sink head portion with a threaded portion extending therefrom.

5. The apparatus of claim 1, wherein the floating member is a plate member having a surface configured as a function of a surface of the packaged device, wherein the surface of the plate member is positioned in direct contact with the surface of the packaged device when the packaged device is received in the socket cavity.

6. The apparatus of claim 1, wherein the packaged device is one of a ball grid array package, a chip scale package, a flip chip package, a flat package, a quad flat package, and a small outline package.

7. The apparatus of claim 1, wherein the perimeter wall member has an inner surface facing towards the adapter axis and an outer surface facing in an opposing direction, wherein the outer surface of the perimeter wall member includes an adhesive retaining surface adjacent the first end thereof.

8. The apparatus of claim 7, wherein the adhesive retaining surface is one or more channels located adjacent the first end of the perimeter wall.

9. The apparatus of claim 7, wherein the apparatus further includes an additional adhesive material applied on the first end of the perimeter wall.

10. The apparatus of claim 7, wherein the apparatus further includes an adhesive material applied to the adhesive retaining surface such that the adhesive material is also in contact with a target board.

11. The apparatus of claim 10, wherein the target board is one of a target board having male pins extending therefrom, a target board including female socket elements, a target board having test points associated therewith, a printed circuit board, and a target board having solder spheres on one side thereof.

12. The apparatus of claim 1, wherein the perimeter wall member includes one or more openings therein for accepting one or more corresponding fastening devices, wherein the fastening devices extend from a target board such that the target board can be mounted adjacent the conductive element layer with contact pads on the target board in electrical contact with the arranged conductive elements thereof.

13. The apparatus of claim 12, wherein the target board is one of a target board having male pins extending therefrom, a target board including female socket elements, a target board having test points associated therewith, a printed circuit board, and a target board having solder spheres on one side thereof.

14. The apparatus of claim 1, wherein the cover member includes a hinged member and a closure structure operable to latch the hinged member in a desired position relative to the perimeter wall member.

15. The apparatus of claim 1, wherein the alignment plate includes a plurality of openings defined therein, wherein each opening corresponds to one of the plurality of the contact elements disposed on the surface of the packaged device.

16. The apparatus of claim 15, wherein the packaged device is a ball grid array package having a plurality of solder spheres disposed on a surface thereof, and wherein each opening defined in the alignment plate corresponds to one of the plurality of solder spheres.

17. The apparatus of claim 1, wherein the packaged device is a ball grid array package having a plurality of solder spheres disposed on a surface thereof, and further wherein the alignment plate includes a single opening defined therein sized to allow solder spheres of the ball grid array package to be in electrical contact with the arranged conductive elements of the conductive element layer.

18. The apparatus of claim 17, wherein the alignment plate includes an outer surface positioned adjacent the perimeter wall member and an inner surface facing inward towards the adapter axis, wherein the inner surface is formed to include arc surface portions corresponding to certain perimeter solder spheres of the ball grid array package.

19. The apparatus of claim 1, wherein the lip portion of the perimeter wall member extending inward towards the adapter axis at the first end of the perimeter wall member terminates in a surface generally parallel to the adapter axis.

20. The apparatus of claim 1, wherein the conductive element layer includes conductive elements therein that are at an angle relative to the adapter axis, and further wherein the lip portion of the perimeter wall member extending inward towards the adapter axis at the first end of the perimeter wall member terminates in a surface positioned at an angle relative to the adapter axis for use in positioning solder spheres adjacent the conductive element layer having angled conductive elements.

21. An adapter apparatus for receiving a packaged device having a plurality of contact elements disposed on a surface thereof, the apparatus comprising:

a perimeter wall member having a length along an adapter axis between a first end of the wall member and a second end of the wall member, wherein the perimeter wall member has an inner surface facing towards the adapter axis and an outer surface facing in an opposing direction, wherein the outer surface of the perimeter wall member includes an adhesive retaining surface adjacent the first end thereof, wherein the adhesive retaining surface includes one or more channels located adjacent the first end of the perimeter wall member such that when an adhesive material is applied to the adhesive retaining surface the adhesive material is also in contact with a target board;

a conductive element layer including arranged conductive elements, wherein the conductive element layer is positioned at the first end of the perimeter wall member orthogonal to the adapter axis, and further wherein the perimeter wall member and the conductive element layer define a socket cavity to receive the packaged device with the plurality of contact elements thereof in electrical contact with the arranged conductive elements of the conductive element layer; and a cover member positioned at the second end of the perimeter wall to close the socket cavity, wherein the cover member is movable to allow the packaged device to be removed from the socket cavity.

22. The apparatus of claim 21, wherein the apparatus further includes an additional adhesive material applied on the first end of the perimeter wall member.

23. The apparatus of claim 22, wherein the additional adhesive material is double-sided tape.

24. The apparatus of claim 21, wherein the target board is one of a target board having male pins extending therefrom, a target board including female socket elements, a target board having test points assocated therewith, a printed circuit board, and a target board having solder spheres on one side thereof.

25. The apparatus of claim 21, wherein the conductive element layer is a conductive elastomer layer.

26. An adapter apparatus for receiving a packaged device having a plurality of contact elements disposed on a surface thereof, the apparatus comprising:

a perimeter wall member having a length along an adapter axis between a first end of the wall member and a second end of the wall member;

a conductive element layer including arranged conductive elements, wherein the conductive element layer is positioned at the first end of the perimeter wall member orthogonal to the adapter axis, and further wherein the perimeter wall member and the conductive element layer define a socket cavity to receive the packaged device with the plurality of contact elements thereof in electrical contact with arranged conductive elements of the conductive element layer, wherein the conductive element layer is a conductive elastomer layer, a cover member positioned at the second end of the perimeter wall to close the socket cavity, wherein the cover member is movable to allow the packaged device to be removed from the socket cavity;

an alignment structure positioned in the socket cavity adjacent the conductive element layer and adjacent the surface of the packaged device on which the plurality of contact elements are disposed to align the contact elements of the packaged device with contact pads on a target board when the adapter apparatus is mounted relative to the target board, wherein the alignment structure comprises an alignment plate positioned orthogonal to the adapter axis between the conductive element layer and the surface of the packaged device on which the plurality of contact elements are disposed, and further wherein the alignment plate comprises a plurality of openings defined therein, wherein each opening corresponds to one of the plurality of the contact elements disposed on the surface of the packaged device to allow each of the contact elements of the packaged device to be in electrical contact with the arranged conductive elements of the conductive element layer; and 27. The apparatus of claim 26, wherein the packaged device is a ball grid array package having a plurality of solder spheres disposed on a surface thereof, and wherein each opening defined in the alignment plate corresponds to one of the plurality of solder spheres.

28. The apparatus of claim 26, wherein the alignment structure includes a lip portion of the perimeter wall member extending inward towards the adapter axis at the first end of the perimeter wall member.

29. The apparatus of claim 28, wherein the lip portion of the perimeter wall member extending inward towards the adapter axis at the first end of the perimeter wall member terminates in a surface generally parallel to the adapter axis.

30. The apparatus of claim 28, wherein the conductive element layer includes conductive elements therein that are at an angle relative to the adapter axis, and further wherein the lip portion of the perimeter wall member extending inward towards the adapter axis at the first end of the perimeter wall member terminates in a surface positioned at an angle relative to the adapter axis for use in positioning solder spheres adjacent the conductive element layer having angled conductive elements therein.

31. An adapter apparatus for receiving a packaged device having a plurality of contact elements disposed on a surface thereof, the apparatus comprising:

a perimeter wall member having a length along an adapter axis between a first end of the wall member and a second end of the wall member;

a conductive element layer including arranged conductive elements, wherein the conductive element layer is positioned at the first end of the perimeter wall member orthogonal to the adapter axis, and further wherein the perimeter wall member and the conductive element layer define a socket cavity to receive the packaged device with the plurality of contact elements thereof in electrical contact with arranged conductive elements of the conductive element layer, wherein the conductive element layer is a conductive elastomer layer;

a cover member positioned at the second end of the perimeter wall to close the socket cavity, wherein the cover member is movable to allow the packaged device to be removed from the socket cavity;

an alignment structure positioned in the socket cavity adjacent the conductive element layer and adjacent the surface of the packaged device on which the plurality of contact elements are disposed to align the contact elements of the packaged device with contact pads on a target board when the adapter apparatus is mounted relative to the target board, wherein the alignment structure is an alignment plate positioned orthogonal to the adapter axis between the conductive element layer and the surface of the packaged device on which the plurality of contact elements are disposed, and further wherein the alignment plate includes at least one opening defined therein to allow the contact elements of the packaged device to be in electrical contact with the arranged conductive elements of the conductive element layer, wherein the packaged device is a ball grid array package having a plurality of solder spheres disposed on a surface thereof, and wherein the alignment plate comprises a single opening defined therein sized to allow the solder spheres of the ball grid array package to be in electrical contact with the arranged coductive elements of the conductive element layer, and further wherein the alignment plate comprises an outer surface postioned adjacent the perimeter wall member and an inner surface facing inward towards the adapter axis, wherein the inner surface is formed to include are surface portions corresponding to certain perimeter solder spheres of the ball grid array package; and an actuator element operable to provide a force on the packaged device in the socket cavity such that the plurality of contact elements are in electrical contact with the arranged conductive elements of the conductive element layer.

* * * * *

UNITED STATES PATENT AND TRADEMARK OFFICE
CERTIFICATE OF CORRECTION

PATENT NO.     : 6,533,589 B1
DATED           : March 18, 2003
INVENTOR(S)  : Palaniappa et al.

It is certified that error appears in the above-identified patent and that said Letters Patent is hereby corrected as shown below:

Column 17,
Line 45, insert -- an actuator element operable to provide a force on the packaged device in the socket cavity such that the plurality of contact elements are in electrical contact with the arranged conductive elements of the conductive element layer. --

Signed and Sealed this

Second Day of March, 2004

JON W. DUDAS
*Acting Director of the United States Patent and Trademark Office*